United States Patent [19]

Thiel et al.

[11] Patent Number: 5,528,064

[45] Date of Patent: Jun. 18, 1996

[54] STRUCTURE FOR PROTECTING INTEGRATED CIRCUITS FROM ELECTRO-STATIC DISCHARGE

[75] Inventors: Frank L. Thiel, Dallas; Michael R. Kay; Louis Hutter, both of Richardson, all of Tex.

[73] Assignee: Texas Instruments Inc., Dallas, Tex.

[21] Appl. No.: 535,367

[22] Filed: Sep. 28, 1995

Related U.S. Application Data

[63] Continuation of Ser. No. 292,112, Aug. 17, 1994, abandoned.

[51] Int. Cl.$^6$ .......................... H01L 23/62; H01L 29/861
[52] U.S. Cl. ..................... 257/362; 257/355; 257/356
[58] Field of Search .................................. 257/362, 356, 257/355, 603

[56] References Cited

U.S. PATENT DOCUMENTS

| | | | |
|---|---|---|---|
| 4,994,874 | 2/1991 | Shimizu et al. | 257/362 |
| 5,001,529 | 3/1991 | Ohshima et al. | 257/362 |
| 5,268,588 | 12/1993 | Marum | 257/362 |
| 5,324,971 | 6/1994 | Notley | 257/356 |
| 5,432,368 | 7/1995 | Jimenez | 257/355 |

FOREIGN PATENT DOCUMENTS

| | | | |
|---|---|---|---|
| 0354478 | 2/1990 | European Pat. Off. | 257/362 |
| 0372820 | 6/1990 | European Pat. Off. | 257/356 |
| 63-260160 | 10/1988 | Japan | 257/362 |
| 3-120758 | 5/1991 | Japan | 257/356 |
| 4-15955 | 1/1992 | Japan | 257/362 |
| 4-280670 | 10/1992 | Japan | 257/362 |

*Primary Examiner*—Ngân V. Ngô
*Attorney, Agent, or Firm*—Rose Alyssa Keagy; Richard L. Donaldson

[57] ABSTRACT

An input protection circuit for a MOS device uses back-to-back zener diodes 30 and 40 with the anodes 130 and 150 connected and floating. This circuitry protects against positive and negative ESD events and does not interfere with the normal operation of the MOS device. The inventive circuit allows an improved gate operating range of the forward bias voltage of a first diode 30 plus the breakdown voltage of a second diode 40 below the supply voltage to the breakdown voltage of the first diode 30 plus the forward bias voltage of the second diode 40 above the supply voltage.

11 Claims, 2 Drawing Sheets

STRUCTURE FOR PROTECTING INTEGRATED CIRCUITS FROM ELECTRO-STATIC DISCHARGE

This application is a Continuation of application Ser. No. 08/292,112, filed Aug. 17, 1994, now abandoned.

FIELD OF THE INVENTION

The present invention relates to electrical circuits and more particularly to methods and circuits for protecting semiconductor circuits from the damaging effects of electrostatic discharges.

BACKGROUND OF THE INVENTION

A well known cause of failure for electronic integrated circuits is exposure to a large and sudden electrostatic discharge (ESD). During the manufacture and use of integrated circuits, both equipment and personnel can build up substantial amounts of charge, often by triboelectric charge buildup during the contact and subsequent removal of dissimilar materials from one another. The built-up electrostatic charge can be quickly discharged when the charged item comes in contact with an integrated circuit, especially when portions of the circuit are connected to power supplies, including equipment ground. The discharge can cause significant damage to the integrated circuit by way of dielectric breakdown of oxides and other films, and also by high levels of conduction through relatively small areas of the circuit arising from reverse breakdown of p-n junctions on the circuit. Especially damaging results can occur if the diode enters the negative resistance region of its diode breakdown characteristics, as sufficient conduction can occur to melt conductive material such as polysilicon or aluminum, as a result of resistive heating. The molten material can flow along the lines of the electric field to create a short circuit, such as a source-to-drain short in a MOSFET. This short circuit will remain after the electrostatic discharge has completed, and is likely to render the integrated circuit useless. Complementary metal oxide semiconductor ("CMOS") field effect circuits are particularly subject to negative consequences of electrostatic discharges. In high density CMOS devices, an electrostatic discharge may develop an extremely high voltage which easily destroys the very thin gate oxides and very short channel devices of these circuits.

To protect CMOS devices against such high voltages, a single zener diode may be coupled to the CMOS device such that the zener diode is connected between the gate and reference supply. This configuration will clamp a voltage spike in one direction and will utilize the forward voltage drop to protect the device in the other direction. This configuration imposes design limitations because it does not permit the ESD sensitive node to operate at a voltage beyond the power supply voltage. Furthermore, a series resistor is usually required to limit power delivered to the zener diode. This added resistor reduces the performance of the circuit by slowing down switching speeds. Other CMOS devices protect against high voltages by requiring two voltage reference supplies, creating a three terminal structure.

Thus a need has arisen for two-terminal CMOS structures with ESD protection but without the requirement of limiting the sensitive protected node (which is usually a MOS gate) to one diode drop beyond its single supply reference.

SUMMARY OF THE INVENTION

The disclosed electrostatic discharge protection method and structure of the present invention comprises back-to-back zener diodes with their anodes connected together and floating. The result is that the voltage range on the sensitive node (which is usually the gate) can extend from a specified voltage above the power supply (zener breakdown voltage of diode 1+forward bias voltage of diode 2) to a specified voltage below the power supply (zener breakdown voltage of diode 2+forward bias voltage of diode 1). This configuration adds no series resistance which facilitates the lowest possible impedance drive and increases device operating speed.

DETAILED DESCRIPTION OF THE PREFERRED EMBODIMENT

Figure 1:
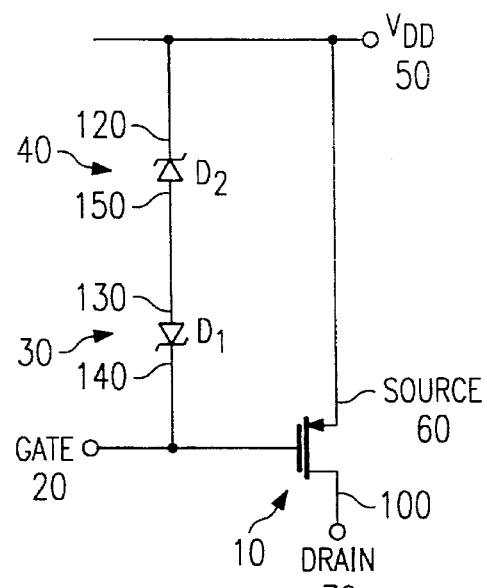
FIG. 1 is a circuit diagram of the present invention coupled to a PMOS transistor being ESD protected.
Figure 2:
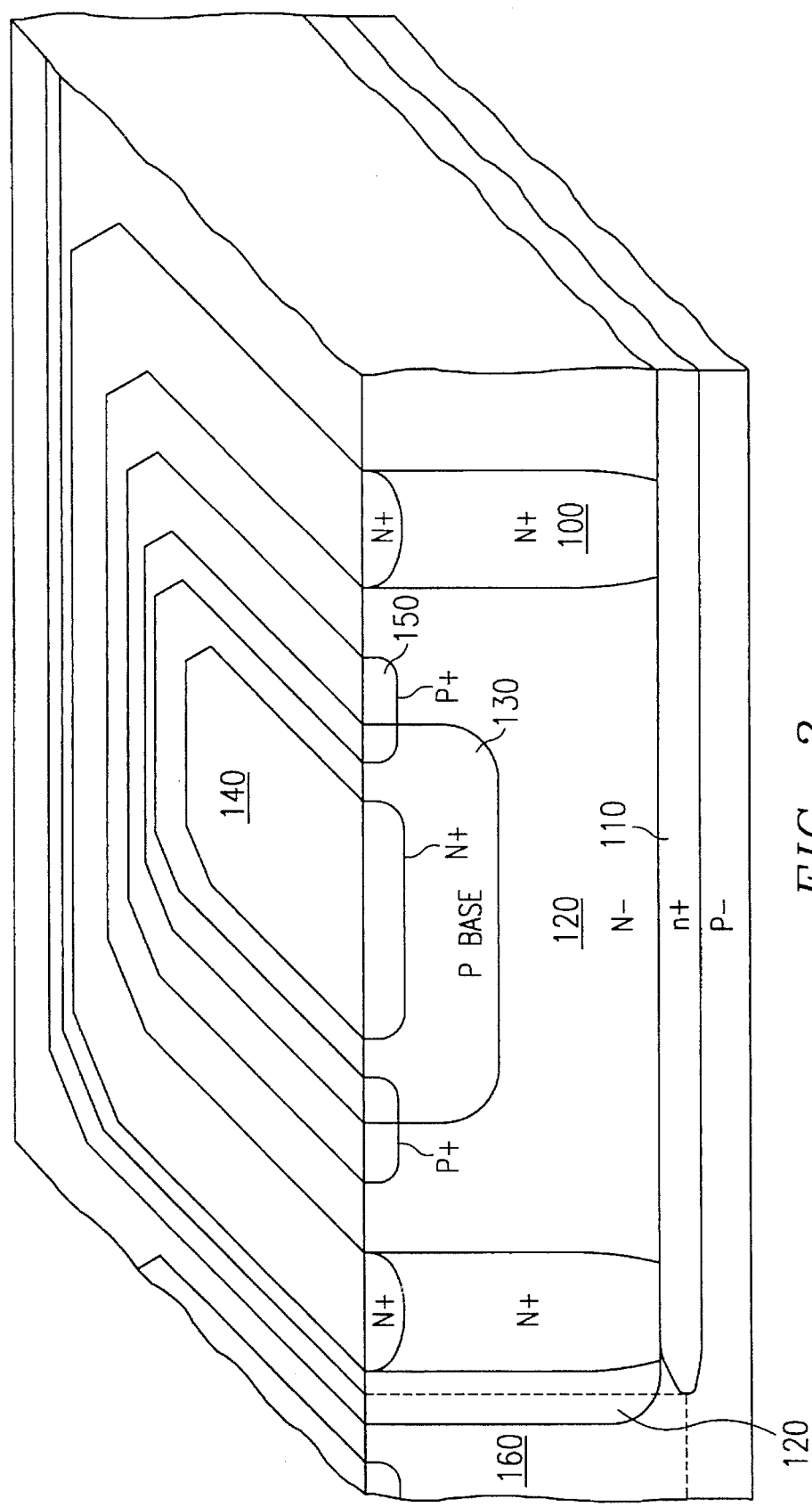
FIG. 2 is a layout and cross sectional diagram of FIG. 1.

Referring to FIGS. 1 and 2 a two terminal ESD structure for protecting sensitive MOS transistor 10 has gate 20 connected to a control signal and to the N+ cathode of a first zener diode 30. The P anode of the first diode 30 is connected to the P+ anode of a second zener diode 40. Thus zener diodes 30 and 40 are arranged back to back with their anodes connected and floating. The N− cathode of the second diode 40 is connected to the supply voltage (Vdd) 50. Supply voltage 50 is also connected to the source 60 of PMOS transistor 10. To facilitate the understanding of the correlation of the circuit of FIG. 1 to the structure of FIG. 2, the diodes of FIG. 1 are marked to show the corresponding labeled regions of FIG. 2.

Figure 4:
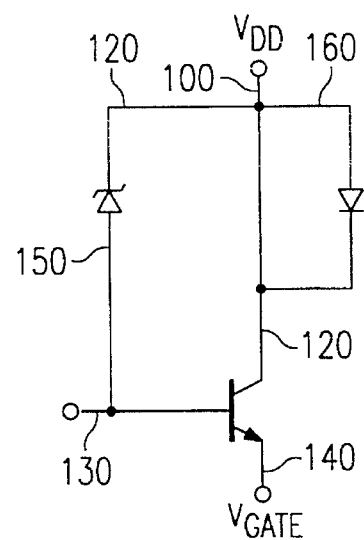
FIG. 4 is a schematic diagram showing the parasitic NPN of the present invention.

First and second zener diodes 30 and 40 of FIG. 1 are structured as an NPN transistor as shown in FIG. 2 to create a compact structure and therefore save substrate chip area. Although the diodes are constructed as an NPN transistor, changes have been made to the typical parasitic NPN structure to reduce the gain commonly associated with a typical NPN. The gain of the NPN shown in FIG. 4 is controlled by the relative depths of region 140 to region 130 as shown in FIG. 2. The shallower that P region 130 is formed, the higher the gain between regions 140 and 120. It has been found that a vital feature of the protection circuit is the shallow high concentration N region 140 relative to P region 130. The key then to reducing gain in this preferred embodiment is to maximize the base width by minimizing the depth of region 140. Shallow N region 140 is preferably approximately 5000 Angstroms deep. This causes the gain to be very low in the device of FIG. 1. The amount of gain is important because the higher the gain of the structure the lower the effective breakdown voltage. The advantageous structure of FIG. 2 allows for the breakdown voltage to be controlled solely by the concentrations of regions 140, 130, and 120.

In FIG. 2, a deep high concentration N region 100 and a buried high concentration N region 110 surrounds a deep low concentration N well region 120 which is isolated from the P-epi 160 and the rest of the integrated circuit. This structure also lowers the conductivity of the N well tank 120 which is the cathode of the second diode 40. As a result, if a current spike is sustained by transistor 10 from region 120 to gate 140, the current can be dissipated without building up a damaging voltage on gate 20. A large voltage on 20 would destroy transistor 10 by destroying the gate oxide. The higher the N+ doping of regions 100 and 110, the lower the effective impedance of lightly doped n-type region 120. The lower the impedance of 120, the more efficiently the current spike is dissipated.

In this preferred embodiment, high concentration doping is in the range of $1E^{18}$ to $1E^{21}$ atoms per cubic centimeter. Low concentration doping is in the range of $1E^{13}$ to $1E^{16}$ atoms per cubic centimeter.

As shown in FIG. 2, another advantage of this structure is that NPN transistor emitter 140 is not created with an implant optimized for transistor performance as is common. Rather, an N-type implant is used which lowers the breakdown gain factor and raises the CEO (Collector to Emitter breakdown with the base Open) of the parasitic NPN shown in FIG. 4. Thus P-type implant 150, which is the anode of second diode 40, allows the breakdown in the base region 130 to be controlled and helps to cancel the parasitic CEO gain. In the preferred embodiment, the region 120 to region 150 junction will break down predictability at 24 volts (which is lower than the region 130 to region 120 junction breakdown and is also lower than the CEO voltage of the NPN).

The ESD structure shown in FIG. 1 allows the protected gate node 20 to swing above and below the supply voltage Vdd 50. If gate 20 goes below the Vdd voltage level it can be safely brought to approximately 24.7 volts (diode 40's breakdown zener voltage of 24 volts plus diode 30's forward bias of 0.7 volts) below Vdd. Alternatively, if gate 20 is brought above Vdd it can be safely used at a level of approximately 7.4 volts (diode 30's breakdown voltage of 6.7 volts plus diode 40's forward bias of 0.7 volts) above Vdd.

Figure 3:
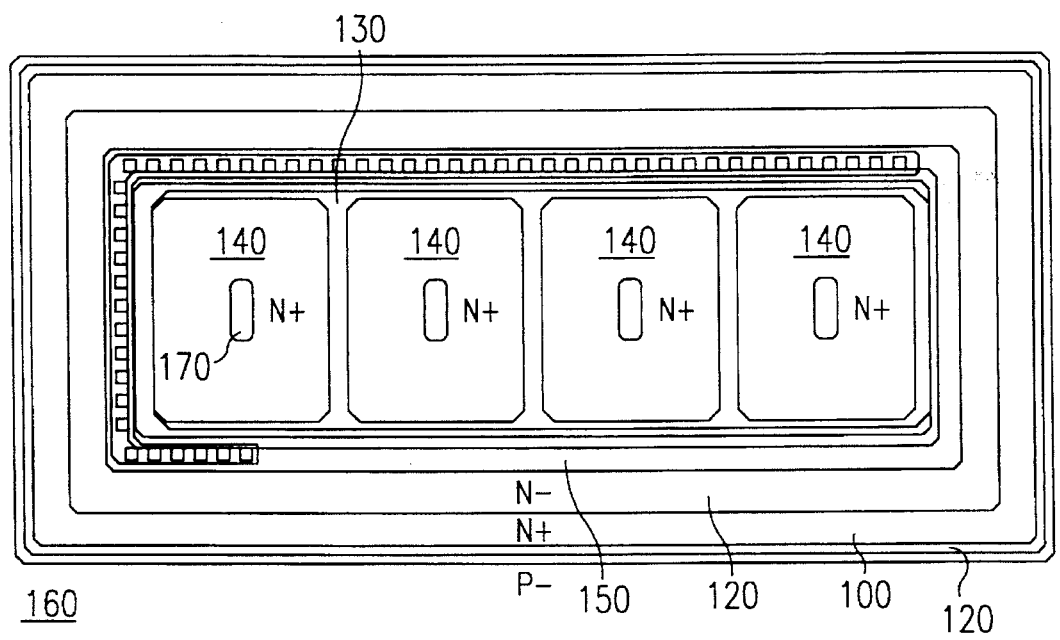
FIG. 3 is plan view of an advantageous embodiment of the present invention.

FIG. 3 shows an advantageous plan view of the present embodiment. The reference numbers corresponding to the numbered regions of FIG. 2 have been added for clarity. Contact 170 is deliberately smaller than cathode region 140 to create a larger region of resistance through regions 140 (all four regions comprising one diode) before breaking down to anode region 130. This ballasting created by the layout design increases the resistance of region 140 and thereby creates a negative feedback which increases the current at which any part of region 140 will have a dramatic enough temperature increase to localize the current, causing thermal runaway and device destruction. This construction advantageously allows large power ESD spikes to be dissipated without damage to the transistor structure 10.

FIG. 3 shows a preferred structure for implementing this invention. The whole diode structure of FIG. 1 is built onto region 120. Forming region 150 as one continuous ring prevents lateral debiasing of the structure of FIG. 1. Another benefit of the ring structure is that SCR (Silicon Controlled Rectifier) latch-up immunity is improved so more current can be dissipated in a controlled manner. The deep high concentration N region 100 is also formed in a ring to minimize resistance and facilitate the even distribution of current around the whole region 120 structure. Region 160 is the P-epi in which the integrated circuit is formed.

An advantage of the invention is that ESD protection has been added without using series resistance, since under normal operation both diodes will be off and therefore there is no interference by the diodes with the normal current path and normal operation of gate 20. Another advantage is that a MOS transistor can have ESD protection without burdening designers with having to tie a fourth terminal to ground (or lowest potential). Therefore clamping is allowed for a typical MOS device that doesn't have the capability to clamp ESD to a ground potential.

Since region 100 contacts region 110 the high gain of the common parasitic PNP of FIG. 4 is virtually eliminated. The high concentration N region 140 in the middle of the base causes current to flow out without debiasing regions 130, 120, and 160. Yet another advantage of this invention is that the compact structure of FIG. 2 allows for two diodes to take the space of one diode in the integrated circuit substrate. This configuration also protects against possible positive and negative ESD events and does not conduct significant current when the device is in normal operation.

Modifications and variations of the invention are possible in light of the above teachings while remaining within the scope of the appended claims. For instance the structure of FIG. 1 could be built using separate diodes instead of the compact structure shown in FIG. 2.

We claim:

1. An electrostatic discharge protection circuit comprising:

an integrated circuit coupled to a first and second diode, said first and second diode providing electrostatic discharge protection for said integrated circuit, said integrated circuit having a first input for receiving an input signal and having a second input for receiving a supply voltage;

said first diode having a cathode coupled to said first input and having an anode coupled to said second diode; and said second diode having a cathode coupled to said second input and having an anode coupled to said first diode;

wherein said first diode is formed by diffusing a heavily doped material of a first conductivity type into a region of a second conductivity type; and said second diode is formed by diffusing a heavily doped material of said second conductivity type into a lightly doped region of said first conductivity type.

2. The circuit of claim 1 wherein said first diode and said second diode are zener diodes.

3. The circuit of claim 1 where said first and second diodes form a NPN transistor.

4. The circuit of claim 1 wherein said gate is capable of operation more than one diode forward bias voltage drop above said supply voltage.

5. The circuit of claim 1 wherein said integrated circuit is a MOS transistor, said first input is a gate, and said second input is a source.

6. An input protection structure with enhanced electrostatic discharge protection formed in a semiconductor substrate having a surface comprising:

a first region of a heavily doped semiconductor layer having a first conductivity type and a face, said first region formed in said semiconductor substrate and below said surface;

a second region of a lightly doped semiconductor layer having said first conductivity type, formed in said substrate and connected to said first region at said face;

a third region of a heavily doped semiconductor layer having said first conductivity type, formed in said second region;

a fourth region having a second conductivity type opposite said first conductivity type, formed in said second region;

a fifth region of a heavily doped semiconductor layer having said first conductivity type, formed inside said fourth region; and a sixth region of a heavily doped semiconductor layer having said second conductivity type, formed in both said second and fourth regions.

7. The structure of claim 6 wherein said fifth region forms an emitter of an NPN transistor, wherein said fourth region forms a base of said NPN transistor, and wherein said second region forms a collector of said NPN transistor.

8. The structure of claim 6 wherein said first conductivity type is N and said second conductivity type is P.

9. The structure of claim 6 wherein said structure is operable to initiate a flow of current through said first, second and third regions responsive to said fourth region reaching a threshold voltage relative to said fifth region, such that a current through said structure is reduced to avoid damaging said structure.

10. The structure of claim 6 wherein said fifth region forms a cathode of a first zener diode, wherein said fourth region forms an anode of said first zener diode, wherein said sixth region forms an anode of a second zener diode, and wherein said second region forms a cathode of said second zener diode.

11. The structure of claim 6 wherein said structure is operable to initiate a flow of current through said fifth regions responsive to said fourth region reaching a threshold voltage relative to said second region, such that a current through said structure is reduced to avoid damaging said structure.

* * * * *